US012586979B2

(12) United States Patent
    Wang et al.

(10) Patent No.: US 12,586,979 B2
(45) Date of Patent: Mar. 24, 2026

(54) OPTICAL MODULE

(71) Applicant: Hisense Broadband Multimedia Technologies Co., Ltd., Qingdao (CN)

(72) Inventors: Xinnan Wang, Qingdao (CN); Dan Li, Qingdao (CN); Benzheng Dong, Qingdao (CN); Jiaao Zhang, Qingdao (CN); Jianwei Mu, Qingdao (CN); Long Zheng, Qingdao (CN)

(73) Assignee: Hisense Broadband Multimedia Technologies Co., Ltd., Qingdao (CN)

( * ) Notice: Subject to any disclaimer, the term of this patent is extended or adjusted under 35 U.S.C. 154(b) by 1029 days.

(21) Appl. No.: 17/710,221

(22) Filed: Mar. 31, 2022

(65) Prior Publication Data

US 2022/0224073 A1      Jul. 14, 2022

Related U.S. Application Data

(63) Continuation of application No. PCT/CN2021/080967, filed on Mar. 16, 2021.

(30) Foreign Application Priority Data

May 14, 2020     (CN) .......................... 202010406778.8

(51) Int. Cl.
    *H01S 5/02345*     (2021.01)
    *H01S 5/02253*     (2021.01)
    *H01S 5/026*       (2006.01)
(52) U.S. Cl.
    CPC ...... *H01S 5/02345* (2021.01); *H01S 5/02253* (2021.01); *H01S 5/0261* (2013.01); *H01S 5/0264* (2013.01)
(58) Field of Classification Search
    CPC ............. H01S 5/02345; H01S 5/02253; H01S 5/0261; H01S 5/0264; H05K 2203/049; G02B 6/428
    See application file for complete search history.

(56) References Cited

U.S. PATENT DOCUMENTS

2004/0021220 A1     2/2004   Kubo
2004/0216918 A1     11/2004  Pendse et al.
                    (Continued)

FOREIGN PATENT DOCUMENTS

CN        2513297 Y      9/2002
CN        1661815 A      8/2005
          (Continued)

OTHER PUBLICATIONS

Machine translation of CN209248493U (Year: 2019).*

(Continued)

*Primary Examiner* — Yuanda Zhang
(74) *Attorney, Agent, or Firm* — Morgan, Lewis & Bockius LLP

(57)                 ABSTRACT

An optical module includes a circuit board and a light emitting assembly. The circuit board includes a first circuit board ground line, a second circuit board ground line and a circuit board signal line. The light emitting assembly is connected to the circuit board, and the light emitting assembly includes a spacer and a laser chip. The spacer includes a first spacer ground line, a second spacer ground line and a spacer signal line. The first spacer ground line is connected to the second spacer ground line through a fourth connection line; or the first spacer ground line is connected to the second circuit board ground line through a fifth connection line; or the second spacer ground line is connected to the first circuit board ground line through a sixth connection line; or the first circuit board ground line is connected to the second circuit board ground line through a seventh connection line.

15 Claims, 7 Drawing Sheets

(56) References Cited

U.S. PATENT DOCUMENTS

| | | | |
|---|---|---|---|
| 2005/0191057 A1 | 9/2005 | Nakamoto et al. | |
| 2007/0003194 A1 | 1/2007 | Ueno et al. | |
| 2011/0180940 A1 | 7/2011 | Oikawa | |
| 2015/0168737 A1* | 6/2015 | Yang | G02B 5/3083 359/489.08 |
| 2015/0296648 A1* | 10/2015 | Kaikkonen | H04B 10/801 361/767 |
| 2017/0310078 A1* | 10/2017 | Hirayama | H01S 5/02345 |
| 2018/0317315 A1 | 11/2018 | Yang et al. | |
| 2020/0335029 A1 | 10/2020 | Gao et al. | |

FOREIGN PATENT DOCUMENTS

| | | | |
|---|---|---|---|
| CN | 102169855 A | 8/2011 |
| CN | 106646777 A | 5/2017 |
| CN | 206149596 U | 5/2017 |
| CN | 106802455 A | 6/2017 |
| CN | 106980158 A | 7/2017 |
| CN | 209248493 U | 8/2019 |
| CN | 110838879 A | 2/2020 |
| CN | 111458811 A | 7/2020 |
| TW | 267957 B | 1/1996 |

OTHER PUBLICATIONS

International Search Report and Written Opinion issued in corresponding International Application No. PCT/CN2021/080967 dated Jun. 17, 2021, with English translation.
Office Action issued in corresponding Chinese Patent Application No. 202010406778.8 dated May 10, 2021 with English translation.

* cited by examiner

OPTICAL MODULE

CROSS-REFERENCE TO RELATED APPLICATIONS

This application is a Continuation Application of International Application No. PCT/CN2021/080967 filed on Mar. 16, 2021, which claims priority to Chinese Patent Application No. 202010406778.8 filed on May 14, 2020, which are incorporated herein by reference in their entirety.

TECHNICAL FIELD

The present disclosure relates to the field of optical communication technologies, and in particular, to an optical module.

BACKGROUND

Due to the higher and higher requirements for communication bandwidth in the field of optical fiber communication, global optical communication is in a period of rapid development. In the field of high-speed data communication, in order to ensure data transmission for a long distance at a high speed, an optical module is generally used to transmit and receive light of different wavelengths in the field.

SUMMARY

An optical module is provided. The optical module includes a circuit board and a light emitting assembly. The circuit board includes a first circuit board ground line, a second circuit board ground line and a circuit board signal line. The light emitting assembly is connected to the circuit board, and the light emitting assembly includes a spacer and a laser chip. The spacer includes a first spacer ground line, a second spacer ground line and a spacer signal line. The first spacer ground line is connected to the first circuit board ground line through a first connection line, the spacer signal line is connected to the circuit board signal line through a second connection line, and the second spacer ground line is connected to the second circuit board ground line through a third connection line. The laser chip is disposed on the spacer and configured to emit an optical signal based on an electrical signal from the circuit board. An anode of the laser chip is electrically connected to the spacer signal line, and a cathode of the laser chip is electrically connected to the first spacer ground line or the second spacer ground line. Connection relationships among the first spacer ground line, the second spacer ground line, the first circuit board ground line and the second circuit board ground line include at least one of the followings: the first spacer ground line is connected to the second spacer ground line through a fourth connection line; the first spacer ground line is connected to the second circuit board ground line through a fifth connection line; the second spacer ground line is connected to the first circuit board ground line through a sixth connection line; or, the first circuit board ground line is connected to the second circuit board ground line through a seventh connection line.

BRIEF DESCRIPTION OF THE DRAWINGS

In order to describe technical solutions in the present disclosure more clearly, accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, actual processes of methods and actual timings of signals to which the embodiments of the present disclosure relate.

DETAILED DESCRIPTION

Figure 1:
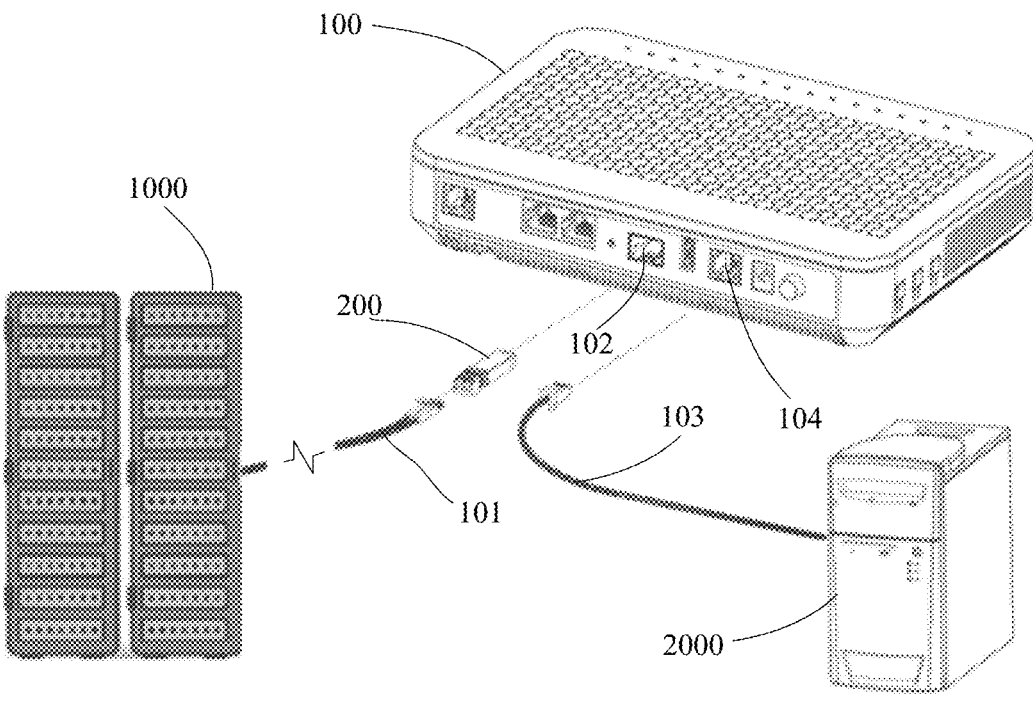
FIG. 1 is a diagram showing a connection relationship of an optical communication system, in accordance with some embodiments.

The technical solutions in the embodiments of the present disclosure will be described below clearly and completely with reference to the accompanying drawings in the embodiments of the present disclosure. However, the described embodiments are merely some but not all of embodiments of the present disclosure. All other embodiments obtained by a person of ordinary skill in the art based on the embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as being open and inclusive, i.e., "including, but not limited to". In the description, the terms such as "one embodiment", "some embodiments", "exemplary embodiments", "example", "specific example" or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms "first" and "second" are only used for descriptive purposes, and cannot be construed as indicating or implying relative importance or implicitly indicating the number of indicated technical features. Thus, features defined as "first" and "second" may explicitly or implicitly include one or more of the features. In the description of the embodiments of the present disclosure, the term "a plurality of" means two or more unless otherwise specified.

In the description of some embodiments, the term "coupled" and "connected" and their extensions may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact. However, the term "coupled" or "communicatively coupled" may also mean that two or more components are not in direct contact with each other, but still cooperate or interact with each other. The embodiments disclosed herein are not necessarily limited to the contents herein.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The use of the phrase "applicable to" or "configured to" herein means an open and inclusive language, which does not exclude devices that are applicable to or configured to perform additional tasks or steps.

The term "about", "substantially" or "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The term such as "parallel", "perpendicular" or "equal" as used herein includes a stated condition and a condition similar to the stated condition. A range of the similar condition is within an acceptable range of deviation. The acceptable range of deviation is determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°. The term "equal" includes absolute equality and approximate equality, and an acceptable range of deviation of the approximate equality may be, for example, a difference between two equals of less than or equal to 5% of either of the two equals.

It will be understood that when a layer or element is referred to as being on another layer or substrate, the layer or element can be directly on another layer or substrate, or there is intermediate layer(s) between the layer or element and another layer or substrate.

In optical communication technology, an optical signal is used to carry information to be transmitted, and the optical signal carrying the information is transmitted to an information processing device such as a computer through an information transmission device such as an optical fiber or an optical waveguide, so as to achieve information transmission. Due to the passive transmission characteristic of the optical signal when being transmitted through the optical fiber or the optical waveguide, low-cost and low-loss information transmission may be achieved. In addition, since a signal transmitted by the information transmission device such as the optical fiber or the optical waveguide is an optical signal, and a signal that may be recognized and processed by the information processing device such as a computer is an electrical signal, in order to establish information connection between the information transmission device such as the optical fiber or the optical waveguide and the information processing device such as the computer, there is a need to achieve interconversion between the electrical signal and the optical signal.

In the field of optical fiber communication technology, an optical may achieve interconversion between the optical signal and the electrical signal. The optical module includes an optical port and an electrical port. The optical module achieves optical communication with the information transmission device such as the optical fiber or the optical waveguide through the optical port, and the optical module achieves electrical connection to an optical network terminal (e.g., an optical modem) through the electrical port. The electrical connection is mainly to implement power supply, I2C signal transmission, data signal transmission, and grounding functions. The optical network terminal transmits the electrical signal to the information processing device such as a computer through a network cable or wireless fidelity (Wi-Fi).

FIG. 1 is a diagram showing a connection relationship of an optical communication system, in accordance with some embodiments. As shown in FIG. 1, an optical communication system includes a remote server 1000, a local information processing device 2000, an optical network terminal 100, an optical module 200, an optical fiber 101 and a network cable 103.

An end of the optical fiber 101 is connected to the remote server 1000, and another end thereof is connected to the optical network terminal 100 through the optical module 200. The optical fiber itself supports long-distance signal transmission, for example, signal transmission over several kilometers (6 kilometers to 8 kilometers). On this basis, if repeaters are used, theoretically, it may be possible to achieve infinite-distance transmission. Therefore, in a typical optical communication system, a distance between the remote server 1000 and the optical network terminal 100 may typically reach several kilometers, dozens of kilometers, or hundreds of kilometers.

An end of the network cable 103 is connected to the local information processing device 2000, and another end thereof is connected to the optical network terminal 100. The local information processing device 2000 includes one or more of a router, a switch, a computer, a mobile phone, a tablet computer or a television.

A physical distance between the remote server 1000 and the optical network terminal 100 is greater than a physical distance between the local information processing device 2000 and the optical network terminal 100. Connection between the local information processing device 2000 and the remote server 1000 is achieved by the optical fiber 101 and the network cable 103, and connection between the optical fiber 101 and the network cable 103 is achieved by the optical module 200 and the optical network terminal 100.

The optical module 200 includes an optical port and an electrical port. The optical port is configured for connecting the optical fiber 101, so that a bidirectional optical signal connection between the optical module 200 and the optical fiber 101 is established. The electrical port is configured for connecting the optical network terminal 100, so that a bidirectional electrical signal connection is established between the optical module 200 and the optical network terminal 100. The optical module 200 may achieve interconversion between the optical signal and the electrical signal, so that a connection is established between the optical fiber 101 and the optical network terminal 100.

For example, an optical signal from the optical fiber 101 is converted into an electrical signal by the optical module 200, and then the electrical signal is input into the optical network terminal 100. An electrical signal from the optical network terminal 100 is converted into an optical signal by the optical module 200, and then the optical signal is input into the optical fiber 101. Since the optical module 200 is a tool for achieving interconversion between the optical signal and the electrical signal, and doesn't have a data processing function, the information does not change in the above photoelectric conversion process.

The optical network terminal 100 includes a housing in a substantially cuboid shape, an optical module interface 102 and a network cable interface 104 that are disposed on the housing. The optical module interface 102 is configured for connecting the optical module 200, so that a bidirectional electrical signal connection is established between the optical network terminal 100 and the optical module 200. The network cable interface 104 is configured for connecting the network cable 103, so that a bidirectional electrical signal connection is established between the optical network terminal 100 and the network cable 103. Connection between the optical module 200 and the network cable 103 is established through the optical network terminal 100.

For example, the optical network terminal 100 transmits an electrical signal from the optical module 200 to the network cable 103, and transmits an electrical signal from the network cable 103 to the optical module 200. Therefore, the optical network terminal 100, as a master monitor of the optical module 200, may monitor operation of the optical module 200. In addition to the optical network terminal 100, the master monitor of the optical module 200 may further includes an optical line terminal (OLT).

A bidirectional signal transmission channel has been established between the remote server 1000 and the local information processing device 2000 through the optical fiber 101, the optical module 200, the optical network terminal 100 and the network cable 103.

Figure 2:
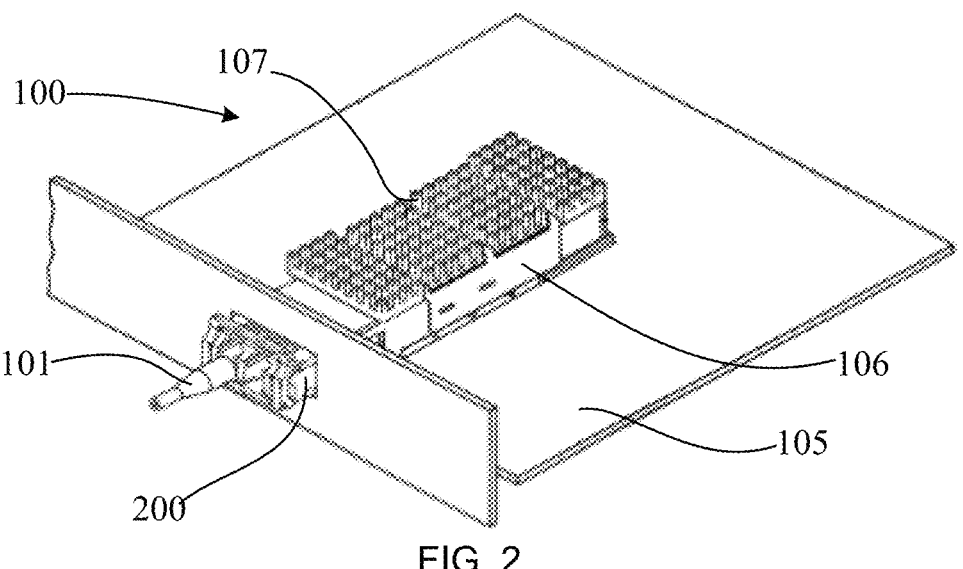
FIG. 2 is a diagram showing a structure of an optical network terminal, in accordance with some embodiments.

FIG. 2 is a diagram showing a structure of an optical network terminal, in accordance with some embodiments. In order to clearly show a connection relationship between the optical module 200 and the optical network terminal 100, FIG. 2 only shows a structure of the optical network terminal 100 that is related to the optical module 200. As shown in FIG. 2, the optical network terminal 100 further includes a circuit board 105 disposed in the housing, a cage 106 disposed on a surface of the circuit board 105, a heat sink 107 disposed on the cage 106, and an electrical connector disposed inside the cage 106. The electrical connector is configured for connecting the electrical port of the optical module 200; and the heat sink 107 has protruding portions such as fins that increase a heat dissipation area.

The optical module 200 is inserted into the cage 106 of the optical network terminal 100 and is fixed by the cage 106. Heat generated by the optical module 200 is conducted to the cage 106 and is then dissipated through the heat sink 107. After the optical module 200 is inserted into the cage 106, the electrical port of the optical module 200 is connected to the electrical connector inside the cage 106, so that a bidirectional electrical signal connection is established between the optical module 200 and the optical network terminal 100. In addition, the optical port of the optical module 200 is connected to the optical fiber 101, so that a bidirectional optical signal connection is established between the optical module 200 and the optical fiber 101.

Figure 3:
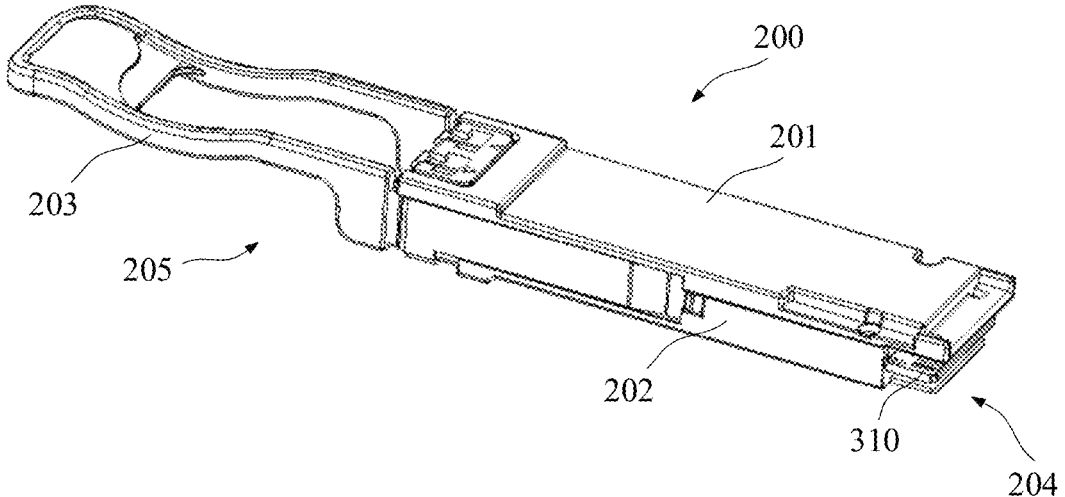
FIG. 3 is a diagram showing a structure of an optical module, in accordance with some embodiments.
Figure 4:
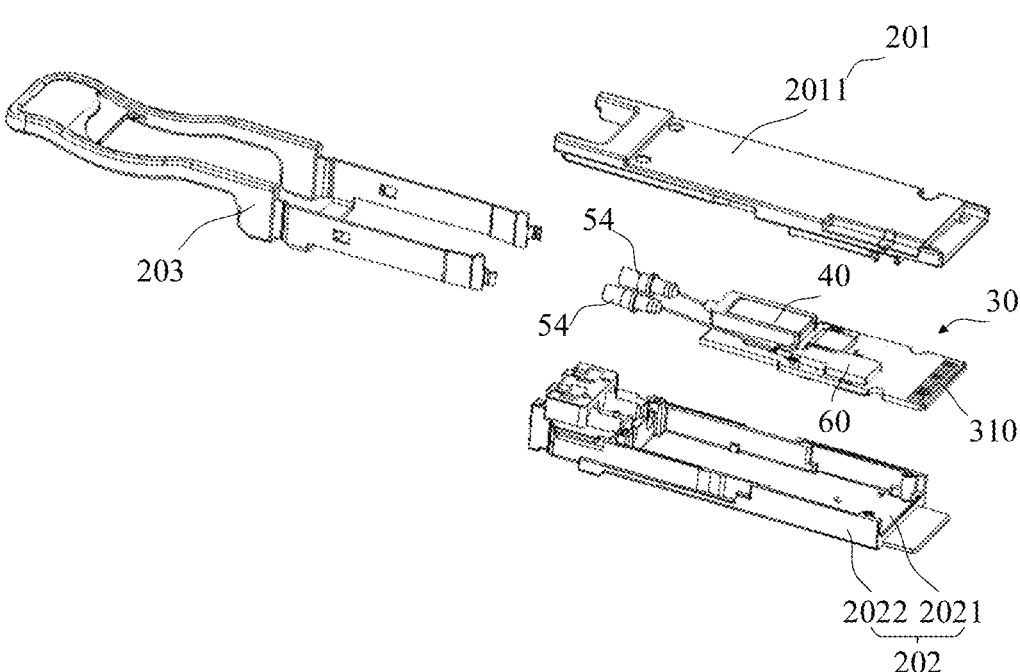
FIG. 4 is a diagram showing an exploded structure of an optical module, in accordance with some embodiments.

FIG. 3 is a diagram showing a structure of an optical module, in accordance with some embodiments. FIG. 4 is a diagram showing an exploded structure of an optical module, in accordance with some embodiments. As shown in FIGS. 3 and 4, the optical module 200 includes a shell, a circuit board 30, a light emitting assembly 40 and a light receiving assembly 60 that are disposed in the shell.

The shell includes an upper shell 201 and a lower shell 202. The upper shell 201 is covered on the lower shell 202 to form the shell having two openings 204 and 205, and an outer contour of the shell is generally in a cuboid shape.

In some embodiments, the lower shell 202 includes a bottom plate 2021 and two lower side plates 2022 that are located on two sides of the bottom plate 2021 and disposed perpendicular to the bottom plate 2021; the upper shell 201 includes a cover plate 2011, and the cover plate 2011 covers the two lower side plates 2022 of the lower shell 202 to form the shell.

In some embodiments, the lower shell 202 includes a bottom plate 2021 and two lower side plates 2022 that are located on two sides of the bottom plate 2021 and disposed perpendicular to the bottom plate 2021; the upper shell 201 includes a cover plate 2011 and two upper side plates that are located on two sides of the cover plate 2011 and disposed perpendicular to the cover plate 2011. The two upper side plates are combined with the two lower side plates 2022 respectively, so that the upper shell 201 covers the lower shell 202.

A direction of a connection line between the two openings 204 and 205 may be the same as a longitudinal direction of the optical module 200, or may not be the same as the longitudinal direction of the optical module 200. For example, the opening 204 is located at an end (a right end in FIG. 3) of the optical module 200, and the opening 205 is also located at an end (a left end in FIG. 3) of the optical module 200. Alternatively, the opening 204 is located at an end of the optical module 200, and the opening 205 is located at a side of the optical module 200. The opening 204 is the electrical port, and a connecting finger 310 of the circuit board 30 extends out from the electrical port 204, and is inserted into the master monitor (e.g., the optical network terminal 100). The opening 205 is the optical port, and is configured for connecting the external optical fiber 101, so that the optical fiber 101 is connected to the light emitting assembly 40 and the light receiving assembly 60 that are inside the optical module 200. The circuit board 30 and optoelectronic devices such as the light emitting assembly 40 and the light receiving assembly 60 are in the above shell.

With help of an assembly manner of combining the upper shell 201 with the lower shell 202, it may be easier to install the circuit board 30 and the optoelectronic devices such as the light emitting assembly 40 and the light receiving assembly 60 into the shell, and the upper shell 201 and the lower shell 202 may provide sealing and protection for these devices. In addition, with help of a shell with a split structure, in a case where the circuit board 30, the optoelectronic devices such as the light emitting assembly 40 and the light receiving assembly 60 are assembled, it may be easier to arrange the positioning elements, heat dissipation elements and electromagnetic shielding elements of these devices, which facilitates automated production.

In some embodiments, the upper shell 201 and the lower shell 202 are made of a metallic material, which helps achieve electromagnetic shielding and heat dissipation.

In some embodiments, the optical module 200 further includes an unlocking component 203 on an outer wall of the shell thereof, and the unlocking component 203 is configured to implement or release a fixed connection between the optical module 200 and the master monitor.

For example, the unlocking component 203 is on outer walls of the two lower side plates 2022 of the lower shell 202, and includes an engagement element that is matched with a cage of the master monitor (e.g., the cage 106 of the optical network terminal 100). In a case where the optical module 200 is inserted into the cage of the master monitor, the optical module 200 is fixed in the cage of the master monitor through the engagement element of the unlocking component 203. In a case where the unlocking component 203 is pulled, the engagement element of the unlocking component 203 moves with the pulling, and then a connection relationship between the engagement element and the master monitor is changed to release the engagement between the optical module 200 and the master monitor, so that the optical module 200 may be pulled out of the cage of the master monitor.

The circuit board 30 includes circuit wires, electronic elements and chips. Through the circuit wires, the electronic elements and the chips are connected together according to circuit design, so as to implement power supply, electrical signal transmission, and grounding functions. The electronic elements may include, for example, a capacitor, a resistor, a triode, and a metal-oxide-semiconductor field-effect transistor (MOSFET). The chips may include, for example, a microcontroller unit (MCU), a laser driver chip, a limiting amplifier, a clock and data recovery (CDR) chip, a power management chip or a digital signal processing (DSP) chip.

The circuit board 30 is generally a rigid circuit board. Since it is made of a relatively hard material, the rigid circuit board may also have a support function. For example, the rigid circuit board may stably support the electronic elements and the chips; in a case where the light emitting assembly 40 and the light receiving assembly 60 are on the circuit board, the rigid circuit board may also stably support the light emitting assembly 40 and the light receiving assembly 60. The rigid circuit board may also be inserted into an electrical connector inside the cage of the master monitor.

The circuit board 30 further includes a connecting finger 310 formed on an end surface thereof, and the connecting finger 310 includes a plurality of independent pins. The circuit board 30 is inserted into the cage 106, and is conductively connected to the electrical connector inside the cage 106 through the connecting finger 310. The connecting finger 310 may be disposed on only one surface (e.g., an upper surface shown in FIG. 4) of the circuit board 30, or may be disposed on both the upper and lower surfaces of the circuit board 30 to adapt to an occasion where a large number of pins are needed. The connecting finger 310 is configured to establish electrical connection with the master monitor to implement power supply, grounding, I2C signal transmission and data signal transmission functions.

Of course, flexible circuit boards are also used in some optical modules. A flexible circuit board is generally used in conjunction with a rigid circuit board as a supplement for the rigid circuit board. For example, the rigid circuit board 30 may be connected to the light emitting assembly 40 and the light receiving assembly 60 through the flexible circuit boards instead of the circuit wires.

The light emitting assembly 40 is configured to convert a data electrical signal into a data optical signal. The light receiving assembly 60 is configured to convert a data optical signal into a data electrical signal.

Figure 5:
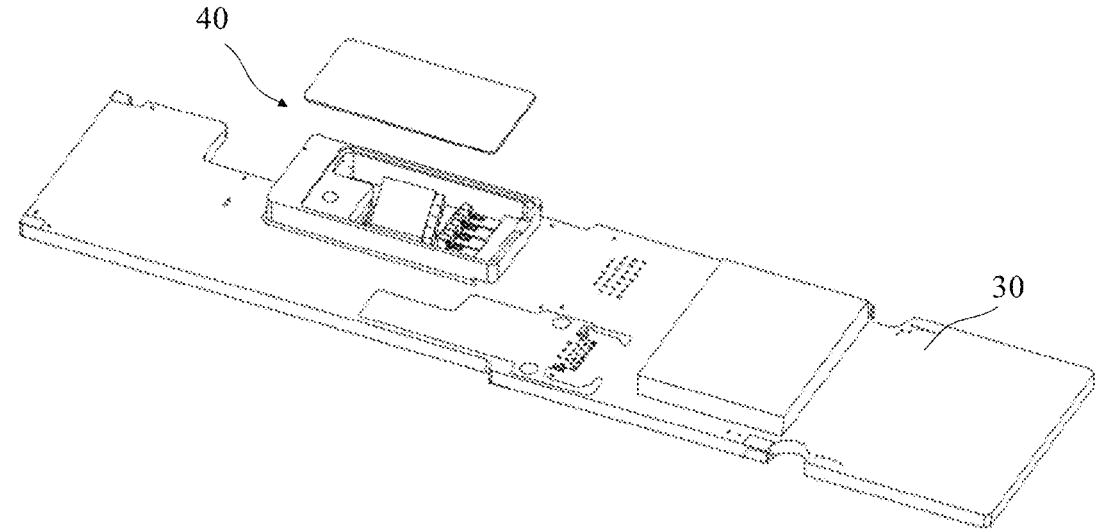
FIG. 5 is a diagram showing structures of a light emitting assembly and a circuit board, in accordance with some embodiments.
Figure 6:
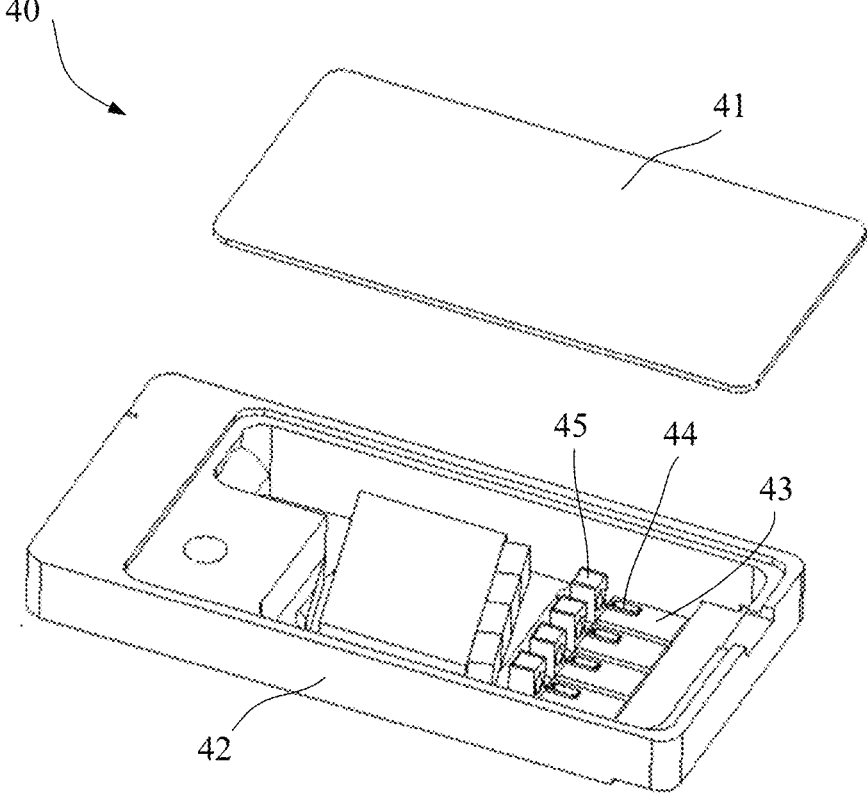
FIG. 6 is a diagram showing an exploded structure of a light emitting assembly, in accordance with some embodiments.

FIG. 5 is a diagram showing structures of a light emitting assembly and a circuit board, in accordance with some embodiments. FIG. 6 is a diagram showing an exploded structure of a light emitting assembly, in accordance with some embodiments. As shown in FIGS. 5 and 6, the light emitting assembly 40 includes a case, a spacer 43, a laser chip 44 and a lens 45.

As shown in FIG. 5, components such as the spacer 43, the laser chip 44 and the lens 45 are mounted in the case, and the case forms encapsulation and protection for these components. The circuit board 30 is inserted into the case of the light emitting assembly 40, and is electrically connected to components in the case through metal connection lines (e.g., gold lines). Of course, these components may also be packaged in a non-hermetic manner.

As shown in FIG. 6, the case of the light emitting assembly 40 includes a cover plate 41 and a lower case 42 with a cavity, and the cover plate 41 is fastened on the lower case 42 to form an accommodating cavity. The components such as the spacer 43, the laser chip 44 and the lens 45 are disposed in the accommodating cavity.

The laser chip 44 converts a data electrical signal from the circuit board 30 into a data optical signal, and light emitted by the laser chip 44 is converged through the lens 45 and then enters an optical fiber adapter 54 (as shown in FIG. 4). The light emitted by the laser chip 44 is transmitted to the optical fiber 101 through the optical fiber adapter 54 and is finally transmitted to an outside of the optical module 200 through the optical fiber 101.

In some embodiments, the spacer 43 is electrically connected to the circuit board 30 and a laser chip 44, and the spacer 43 is configured to transmit signals and bear devices.

Figures 7, 8:
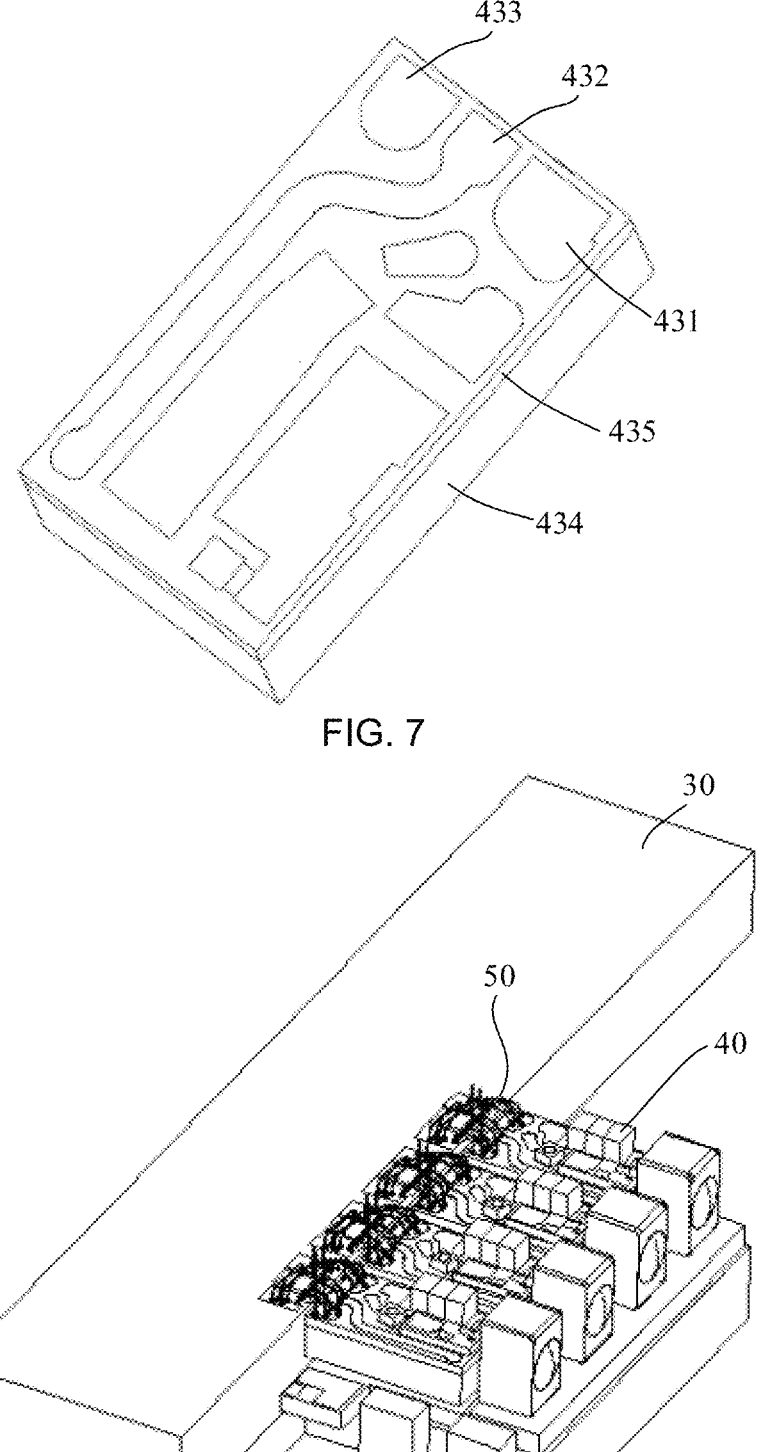
FIG. 7 is a diagram showing a structure of a spacer, in accordance with some embodiments.
FIG. 8 is a diagram showing a connection manner between a circuit board and a light emitting assembly, in accordance with some embodiments.

FIG. 7 is a diagram showing a structure of a spacer, in accordance with some embodiments. As shown in FIG. 7, the spacer 43 includes an insulating heat-conducting layer 434 and a metal layer 435.

The insulating heat-conducting layer 434 and the metal layer 435 are stacked, and a side of the insulating heat-conducting layer 434 away from the metal layer 435 is in contact with a semiconductor cooler or the case of the light emitting assembly 40.

In some embodiments, since ceramic materials have good thermal conductivity and insulating properties, the insulating heat-conducting layer 434 is made of ceramic materials. Of course, materials of the insulating heat-conducting layer 434 are not limited to this.

The metal layer 435 is electrically connected to the circuit board 30 and the laser chip 44, so as to transmit a high-frequency data electrical signal from the circuit board 30 to the laser chip 44. The laser chip 44 emits an optical signal based on the electrical signal. A ground-signal-ground (GSG) mode is used as a transmission mode of high-frequency data electrical signals between the circuit board 30 and the metal layer 435, and the metal layer 435 includes a first spacer ground line 431, a spacer signal line 432 and a second spacer ground line 433. The first spacer ground line

431 and the second spacer ground line 433 are disposed on two opposite sides of the spacer signal line 432. For example, the first spacer ground line 431 and the second spacer ground line 433 are disposed, in a direction perpendicular to an extension direction of the spacer signal line 432, on two opposite sides of the spacer signal line 432.

It will be noted that, layouts of the first spacer ground line 431, the spacer signal line 432 and the second spacer ground line 433 are not limited to the above design, and other layouts may be designed according to requirements such as a signal transmission rate and layouts of components.

In some embodiments, a cathode of the laser chip 44 may be fixed on the first spacer ground line 431 or the second spacer ground line 433 by welding or conductive glue, so that the cathode of the laser chip 44 is electrically connected to the first spacer ground line 431 or the second spacer ground line 433. An anode of the laser chip 44 may be connected to the spacer signal line 432 through a connection line.

During the operation of the optical module 200, a high-frequency data electrical signal from the master monitor is transmitted to chips such as the clock and data recovery chip and the laser driver chip through the connecting finger 310 of the circuit board 30. The chips such as the clock and data recovery chip and the laser driver chip perform processing such as signal shaping and amplitude adjustment on the high-frequency data electrical signal received by the optical module 200, so as to obtain a modulation signal capable of modulating light into an optical signal. Then, the modulation signal is transmitted to the laser chip 44 disposed on the spacer 43, so that the laser chip 44 emits a data optical signal based on the modulation signal.

Figure 9:
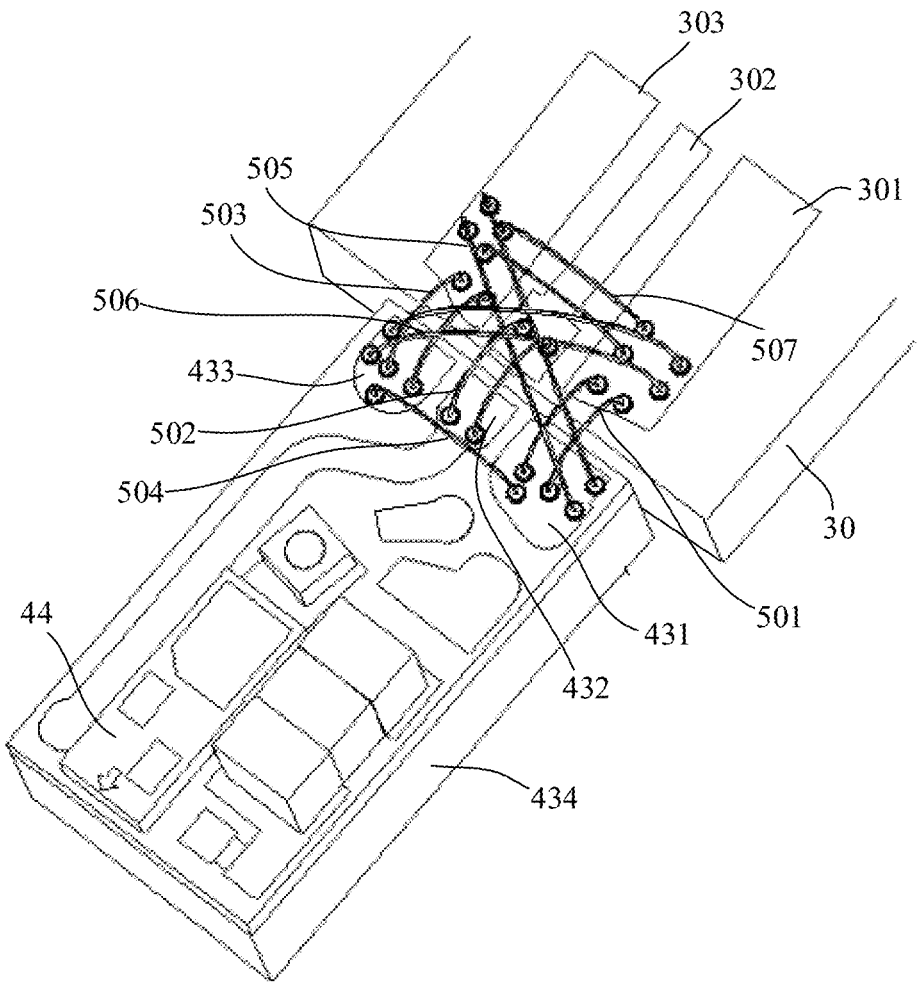
FIG. 9 is a partial structural diagram of a circuit board and a light emitting assembly, in accordance with some embodiments.

FIG. 8 is a diagram showing a connection manner between a circuit board and a light emitting assembly, in accordance with some embodiments. FIG. 9 is a partial structural diagram of a circuit board and a light emitting assembly, in accordance with some embodiments. As shown in FIGS. 8 and 9, in order to ensure the signal transmission mode is the GSG mode, the circuit board 30 includes a first circuit board ground line 301, a circuit board signal line 302 and a second circuit board ground line 303 that are disposed on its surface. The first circuit board ground line 301 and the second circuit board ground line 303 are arranged on two opposite sides of the circuit board signal line 302. For example, the first circuit board ground line 301 and the second circuit board ground line 303 are arranged, in a direction perpendicular to an extension direction of the circuit board signal line 302, on two opposite sides of the circuit board signal line 302. Wires of the spacer 43 and the circuit board 30 are connected together through connection lines 50 with help of a wire bonding process. As shown in FIG. 9, the first spacer ground line 431 of the spacer 43 is connected to the first circuit board ground line 301 of the circuit board 30 through a first connection line 501, the spacer signal line 432 of the spacer 43 is connected to the circuit board signal line 302 of the circuit board 30 through a second connection line 502, and the second spacer ground line 433 of the spacer 43 is connected to the second circuit board ground line 303 of the circuit board 30 through a third connection line 503, so as to send the high-frequency data electrical signal from the circuit board 30 to the laser chip 44 disposed on the spacer 43.

Through the above connection manner, the laser chip 44 emits an optical signal based on a high-frequency data electrical signal and a bias current which are from the circuit board 30. The optical signal enters the optical fiber adapter 54 through the lens 45, and finally is transmitted to the outside of the optical module through the optical fiber 101 connected to the optical fiber adapter 54.

In some embodiments, the circuit board 30 includes a ground metal layer 320, and the ground metal layer 320 is disposed on a surface of the circuit board 30 opposite to a surface of the circuit board 30 on which the first circuit board ground line 301 is located. The spacer 43 includes a ground metal layer 436, and the ground metal layer 436 is disposed on a side of the insulating heat-conducting layer 434 away from the metal layer 435. The circuit board 30 or the spacer 43 includes a ground hole. A ground hole of the circuit board 30 corresponds to at least one of the first circuit board ground line 301 or the second circuit board ground line 303, and a ground hole of the spacer 43 corresponds to at least one of the first spacer ground line 431 or the second spacer ground line 433, so that at least one of the first circuit board ground line 301, the second circuit board ground line 303, the first spacer ground line 431 or the second spacer ground line 433 is electrically connected to a corresponding ground metal layer through a corresponding ground hole, so that a return path of a high-frequency signal is shortened.

For example, the circuit board 30 includes a ground hole corresponding to the first circuit board ground line 301. The ground hole penetrates the circuit board 30, so that the first circuit board ground line 301 is electrically connected to the ground metal layer 320 of the circuit board 30. Alternatively, the spacer 43 includes a ground hole corresponding to the first spacer ground line 431. The ground hole penetrates the spacer 43, so that the first spacer ground line 431 is electrically connected to the ground metal layer 436 of the spacer 43. Alternatively, the circuit board 30 includes a ground hole corresponding to the second circuit board ground line 303, and the spacer 43 includes a ground hole corresponding to the second spacer ground line 433. The ground hole corresponding to the second circuit board ground line 303 penetrates the circuit board 30, so as to achieve an electrical connection between the second circuit board ground line 303 and the ground metal layer 320 of the circuit board 30. The ground hole corresponding to the second spacer ground line 433 penetrates the spacer 43, so as to achieve an electrical connection between the second spacer ground line 433 and the ground metal layer 436 of the spacer 43.

In order to improve a communication rate of the optical module 200, a plurality of groups of optical emission paths are arranged inside the optical module 200, for example, four groups of optical emission paths are shown in FIG. 8. The more the number of optical emission paths, the larger a volume of the optical module 200. In order to meet miniaturization requirements of the optical module 200, there is a need to reduce a size of each group of the optical emission paths. As a result, ground lines of the spacer 43 and the circuit board 30 are relatively thin, that is, areas of the ground lines are small, and thus a ground hole may not be disposed at a position of a ground line.

To this end, in some embodiments, as shown in FIG. 9, connections among the first spacer ground line 431, the second spacer ground line 433, the first circuit board ground line 301 and the second circuit board ground line 303 further include at least one of the followings: the first spacer ground line 431 of the spacer 43 is connected to the second spacer ground line 433 of the spacer 43 through a fourth connection line 504, the first spacer ground line 431 of the spacer 43 is connected to the second circuit board ground line 303 of the circuit board 30 through a fifth connection line 505, the second spacer ground line 433 of the spacer 43 is connected to the first circuit board ground line 301 of the circuit board 30 through a sixth connection line 506, or the first circuit board ground line 301 of the circuit board 30 is connected to the second circuit board ground line 303 of the circuit board 30 through a seventh connection line 507.

Ground lines of the spacer 43 and the circuit board 30 are connected together by at least one of the fourth connection line 504 to the seventh connection line 507, so that a length of a return path of a high-frequency data electrical signal and an area surrounded by the return path of the high-frequency data electrical signal may be effectively reduced, and in turn, electromagnetic interference radiation of signals is reduced, signal crosstalk between paths is prevented, and transmission of the high-frequency data electrical signal between the circuit board 30 and the spacer 43 is kept in the GSG mode.

Signal transmission is performed between the circuit board 30 and the spacer 43 through the second connection line 502. Since a connection line is usually thin, that is, a diameter of the connection line is small, and parasitic inductance introduced by the connection line is large. In addition, with improvement of the communication rate of the optical module, the parasitic inductance introduced by the connection line continues to increase, and influence on optoelectronic performance of the optical module is also more and more obvious. Therefore, the number of each of the above first connection line 501 to third connection line 503 is set to be two or more, and a diameter of each of an entirety formed by first connection lines 501, an entirety formed by second connection lines 502 and an entirety formed by third connection lines 503 may be increased. In this way, inductance generated during operation of the optical module may be reduced, so that the optoelectronic performance of the optical module is improved.

Of course, the present disclosure is not limited to providing a plurality of first connection lines 501, a plurality of second connection lines 502 or a plurality of third connection lines 503. In some embodiments, there are only a plurality of the first connection lines 501, or there are only a plurality of the second connection lines 502, or there are only a plurality of the third connection lines 503. In other embodiments, there are a plurality of the first connection lines 501 and a plurality of the second connection lines 502, or there are a plurality of the first connection lines 501 and a plurality of the third connection lines 503, or there are a plurality of the second connection lines 502 and a plurality of the third connection lines 503.

Of course, numbers of the first connection lines 501 to third connection lines 503 may be the same or different. For example, as shown in FIG. 9, numbers of the first connection lines 501 to the third connection lines 503 are the same, and each are two. In addition, ground lines of the circuit board 30 and ground lines of the spacer 43 are connected together through connection lines, instead of setting ground holes at positions of circuit board ground lines and spacer ground lines; solder joints of the connection lines occupy a smaller area than the ground holes. Therefore, numbers of first connection lines 501, the second connection lines 502 and the third connection lines 503 may be increased, for limited areas of the circuit board ground lines and the spacer ground lines.

It will be noted that, it is not limited to only using a method of connecting ground lines of the circuit board 30 and ground lines of the spacer 43 through connection lines to shorten the return path of the high-frequency signal. According to actual areas of the ground lines of the spacer 43 and the ground lines of the circuit board 30, it is possible to shorten the return path of the high-frequency signal with help of combining the manner of connecting the ground lines of the circuit board to the ground lines of the spacer through the connection lines, with a manner of connecting the ground lines of the circuit board and the ground lines of the spacer to a corresponding ground metal layer through a corresponding ground hole.

For example, the first spacer ground line 431 of the spacer 43 is connected to the second spacer ground line 433 of the spacer 43 through the fourth connection line 504, and the first circuit board ground line 301 and the second circuit board ground line 303 of the circuit board 30 are connected to the ground metal layer 320 of the circuit board 30 through ground holes. Alternatively, the first spacer ground line 431 of the spacer 43 is connected to the second circuit board ground line 303 of the circuit board 30 through the fifth connection line 505, and the second spacer ground line 433 of the spacer 43 is connected to the ground metal layer 436 of the spacer 43 through a ground hole. Alternatively, the second spacer ground line 433 of the spacer 43 is connected to the first circuit board line 301 of the circuit board 30 through the sixth connection line 506, and the second circuit board ground line 303 of the circuit board 30 is connected to the ground metal layer 320 of the circuit board 30 through a ground hole. Alternatively, the first circuit board ground line 301 of the circuit board 30 is connected to the second circuit board ground line 303 of the circuit board 30 through the seventh connection line 507, and the first spacer ground line 431 and the second spacer ground line 433 of the spacer 43 are connected to the ground metal layer 436 of the spacer 43 through ground holes.

Figure 10:
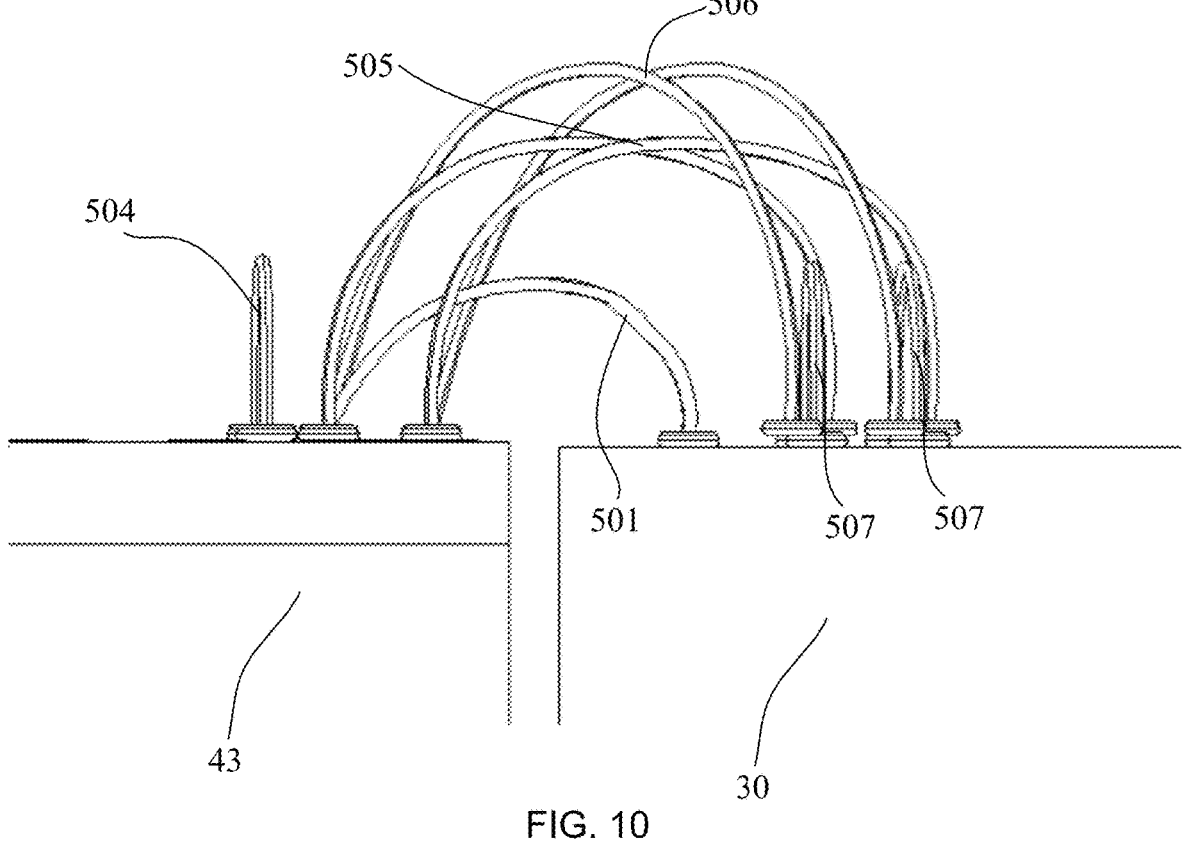
FIG. 10 is a partial side view of a circuit board and a spacer, in accordance with some embodiments.

FIG. 10 is a partial side view of a circuit board and a spacer, in accordance with some embodiments. The impedance matching requirements (e.g., 50 ohms±10%) need to be met for the signal transmission between the circuit board 30 and the spacer 43, that is, a length of a connection line for connecting the spacer signal line 432 of the spacer 43 and the circuit board signal line 302 of the circuit board 30 is limited by the impedance matching requirements. Therefore, in order to facilitate the control of lengths of the first connection line 501, the second connection line 502 and the third connection line 503, as shown in FIG. 10, the first connection line 501, the second connection line 502 and the third connection line 503 are welded first, during wire bonding, and then other connection lines for connecting ground lines are welded.

In some embodiments, in a case where the above connection lines are welded, ends of the connection lines may be melted into metal solder balls at a high temperature, and then the connection lines may be welded to the above ground lines or signal lines through the metal solder balls by applying certain pressure. Alternatively, in order to improve welding speed, ends of the connection lines may be welded to the above ground lines or signal lines by a pressure welding method (e.g., using a gold wire bonding cleaver). Alternatively, both ends of each connection line are welded by a combination of the above two welding methods.

As shown in FIG. 10, the fifth connection line 505 is covered on the first connection line 501 to the third connection line 503 (the second connection line 502 and the third connection line 503 are not shown in FIG. 10), that is, the first connection line 501 to the third connection line 503 are spatially surrounded by the fifth connection line 505, so that the high-frequency data electrical signal transmitted between the circuit board 30 and the spacer 43 may be covered, and it is possible to keep the signal transmission mode between the circuit board 30 and the spacer 43 to be the GSG mode. Based on the same principles, the sixth connection line 506 may also cover on the first connection line 501 to the third connection line 503.

In addition, in order to nicely cover the first connection line 501 to the third connection line 503, the fourth connection line 504 and the seventh connection line 507 are respectively arranged on outer sides of the first connection line 501, the second connection line 502 and the third connection line 503. That is, solder joints of the fourth connection line 504 on the spacer ground lines are disposed at positions closer to the laser chip 44 than solder joints of the first connection line 501 to the third connection line 503 on the spacer ground lines, and solder joints of the seventh connection line 507 on the circuit board ground lines are disposed at positions closer to the connecting finger of the circuit board 30 than solder joints of the first connection line 501 to the third connection line 503 on the circuit board ground lines.

In some embodiments, in order to nicely cover the first connection line 501 to the third connection line 503 and to be grounded, the number of each of the above fourth connection line 504 to the seventh connection line 507 may be set to be two or more. Of course, the present disclosure is not limited to providing a plurality of fourth connection lines 504 to seventh connection lines 507. In some embodiments, there may be only a plurality of fourth connection lines 504, or there may be only a plurality of fifth connection lines 505 and a plurality of sixth connection lines 506, or there may be only a plurality of fourth connection lines 504, a plurality of sixth connection lines 506 and a plurality of seventh connection lines 507.

Of course, the numbers of the above fourth connection lines 504 to seventh connection lines 507 may be the same or different. For example, as shown in FIG. 9, there are two seventh connection lines 507, one fourth connection lines 504, two fifth connection lines 505 and two sixth connection lines 506.

Figure 11:
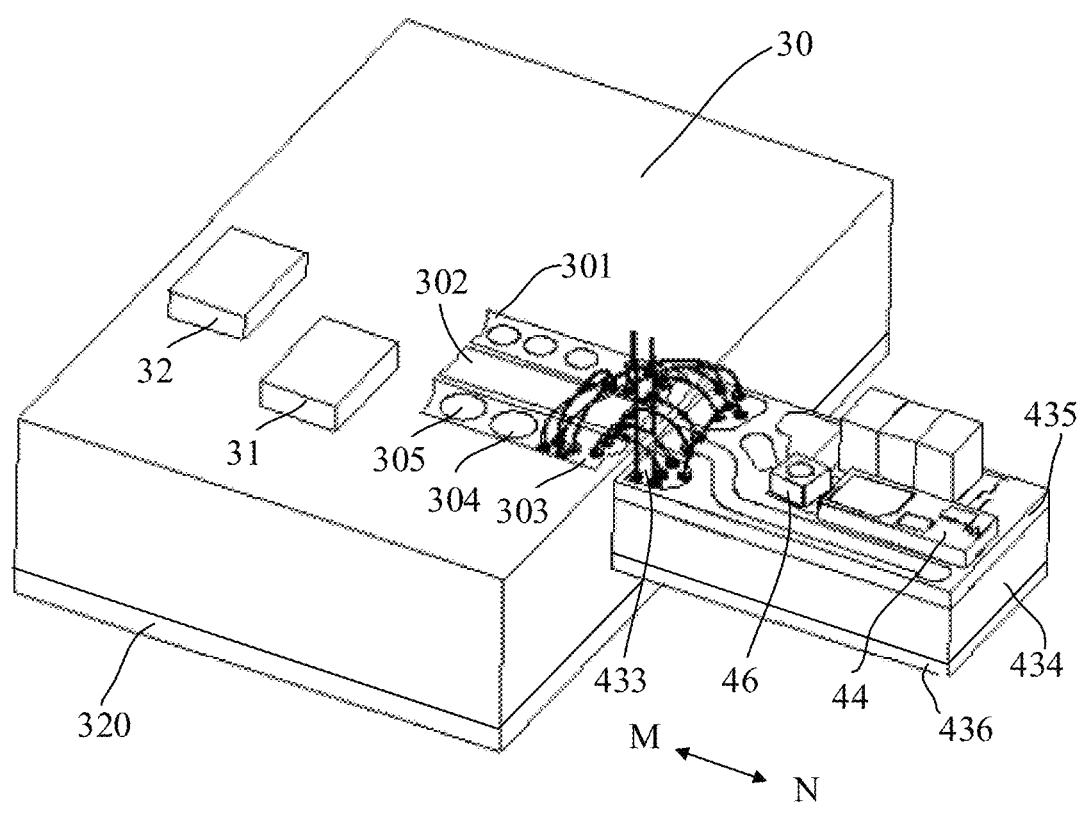
FIG. 11 is a partial structural diagram of a circuit board and a spacer, in accordance with some embodiments.

Generally, the circuit board 30 is designed as a multi-layer circuit board, and circuits of the circuit board 30 are laid out on various layers of the circuit board 30 to reduce an area of the circuit board 30. FIG. 11 is a partial structural diagram of a circuit board and a spacer, in accordance with some embodiments. As shown in FIG. 11, the light emitting assembly 40 further includes a backlight detector 46. The backlight detector 46 is disposed on a backlight side of the laser chip 44. The optical fiber adapter 54 is disposed on a light-emitting side of the laser chip 44. The laser chip 44 includes a light outlet for emitting an optical signal in an M direction and a light outlet for emitting an optical signal in an N direction. A light-sensitive surface of the backlight detector 46 corresponds to the light outlet of the laser chip 44 for emitting the optical signal in the M direction. Among optical signals emitted by the laser chip 44, a high-power optical signal propagates toward the optical fiber adapter 54 (in the N direction), and a low-power optical signal propagates toward the backlight detector 46 (in the M direction).

The backlight detector 46 is configured to receive the low-power optical signal emitted by the laser chip 44 and monitor power of the low-power optical signal emitted by the laser chip 44. Power of light entering the backlight detector 46 is generally much smaller than total power of light emitted by the laser chip 44, and the power of the light entering the backlight detector 46 is usually set to be $\frac{1}{10}$ of the total power of the light emitted by the laser chip 44. Power of the light emitted by the laser chip 44 in the N direction may be monitored by the backlight detector 46.

The backlight detector 46 generates a photocurrent based on the received optical signal, and transmits the photocurrent to a microprocessor 31 disposed on a surface of the circuit board 30. Since the above photocurrent signal is a low-frequency signal, wires for transmitting the low-frequency signal are arranged on a layer of the circuit board 30 that is different from a layer on which the microprocessor 31 is located. For example, the microprocessor 31 is disposed on a first layer of the circuit board 30, and the wires for transmitting the low-frequency signal are arranged on a second or third layer of the circuit board 30.

In order to achieve an electrical connection between the backlight detector 46 and the microprocessor 31, and shorten a transmission distance of the low-frequency signal, as shown in FIG. 11, the circuit board 30 includes a backlight detector welding hole 304, and a position of the backlight detector welding hole 304 corresponds to a position of the second circuit board ground line 303. The backlight detector welding hole 304 is electrically connected to the second circuit board ground line 303, and the backlight detector welding hole 304 extends to a layer of the circuit board 30 for transmitting the low-frequency signal. The backlight detector 46 is electrically connected to the second spacer ground line 433. In this case, the backlight detector 46 is electrically connected to the microprocessor 31 through the second spacer ground line 433, the third connection line 503, the second circuit board ground line 303, the backlight detector welding hole 304 and the wires for transmitting the low-frequency signal. The photocurrent output by the backlight detector 46 may be transmitted to the microprocessor 31, so as to achieve power monitoring of the light emitted by the laser chip 44 in the N direction.

In some embodiments, the circuit board 30 includes a bias current source welding hole 305, and a position of the bias current source welding hole 305 corresponds to the position of the second circuit board ground line 303. The bias current source welding hole 305 is electrically connected to the second circuit board ground line 303, and the bias current source welding hole 305 extends to a layer of the circuit board 30 for transmitting the bias current signal. The laser chip 44 is electrically connected to the second spacer ground line 433. In this case, the laser chip 44 is electrically connected to the laser driver chip 32 through the second spacer ground line 433, the third connection line 503, the second circuit board ground line 303, the bias current source welding hole 305, and wires for transmitting the bias current signal. The bias current output by the laser driver chip 32 is transmitted to the laser chip 44.

Of course, the above backlight detector welding hole 304 and the bias current source welding hole 305 may also be disposed at positions corresponding to the first circuit board ground line 301. By disposing the backlight detector welding hole 304 and the bias current source welding hole 305 at positions corresponding to the ground lines, the area of the circuit board 30 and a signal transmission distance between devices may be reduced.

The foregoing descriptions are merely specific implementations of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the scope of the present disclosure shall be subject to the protection scope of the claims.

What is claimed is:

1. An optical module, comprising:
 a circuit board including a first circuit board ground line, a second circuit board ground line and a circuit board signal line;

a light emitting assembly connected to the circuit board;
wherein the light emitting assembly includes:
a spacer including a first spacer ground line, a second spacer ground line and a spacer signal line, the first spacer ground line being connected to the first circuit board ground line through a first connection line, the spacer signal line being connected to the circuit board signal line through a second connection line, and the second spacer ground line being connected to the second circuit board ground line through a third connection line; and
a laser chip disposed on the spacer and configured to emit an optical signal based on an electrical signal from the circuit board, an anode of the laser chip being electrically connected to the spacer signal line, and a cathode of the laser chip being electrically connected to the first spacer ground line or the second spacer ground line;
wherein connection relationships among the first spacer ground line, the second spacer ground line, the first circuit board ground line and the second circuit board ground line include at least one of the followings:
the first spacer ground line is connected to the second spacer ground line through a fourth connection line;
the first spacer ground line is connected to the second circuit board ground line through a fifth connection line;
the second spacer ground line is connected to the first circuit board ground line through a sixth connection line; or,
the first circuit board ground line is connected to the second circuit board ground line through a seventh connection line;
wherein the circuit board further includes:
a circuit board ground layer, the circuit board ground layer being disposed on a surface of the circuit board opposite to a surface on which the first circuit board ground line and the second circuit board ground line are located; and
a circuit board ground hole corresponding to at least one of the first circuit board ground line or the second circuit board ground line, the circuit board ground hole penetrating the circuit board, so that the at least one of the first circuit board ground line or the second circuit board ground line is electrically connected to the circuit board ground layer.

2. The optical module according to claim 1, wherein the fifth connection line is covered on the first connection line, the second connection line and the third connection line; and/or,
the sixth connection line is covered on the first connection line, the second connection line and the third connection line.

3. The optical module according to claim 2, wherein a solder joint of the fourth connection line on the spacer is closer to the laser chip than solder joints of the first connection line, the second connection line and the third connection line on the spacer;
and/or,
a solder joint of the seventh connection line on the circuit board is farther from the laser chip than solder joints of the first connection line, the second connection line and the third connection line on the circuit board.

4. The optical module according to claim 1, wherein numbers of the first connection line, the second connection line and the third connection line satisfy at least one of the followings:

there are a plurality of first connection lines;
there are a plurality of second connection lines; or,
there are a plurality of third connection lines.

5. The optical module according to claim 1, wherein numbers of the fourth connection line, the fifth connection line, the sixth connection line and the seventh connection line satisfy at least one of the followings:
there are a plurality of fourth connection lines;
there are a plurality of fifth connection lines;
there are a plurality of sixth connection lines; or,
there are a plurality of seventh connection lines.

6. The optical module according to claim 1, wherein the spacer further includes:
a spacer ground layer, the spacer ground layer being disposed on a surface of the spacer opposite to a surface on which the first spacer ground line and the second spacer ground line are located; and
a spacer ground hole corresponding to at least one of the first spacer ground line or the second spacer ground line, the spacer ground hole penetrating the spacer, so that the at least one of the first spacer ground line or the second spacer ground line is electrically connected to the spacer ground layer.

7. The optical module according to claim 1, wherein the first circuit board ground line and the second circuit board ground line are disposed on two opposite sides of the circuit board signal line;
the first spacer ground line and the second spacer ground line are disposed on two opposite sides of the spacer signal line.

8. The optical module according to claim 1, wherein the light emitting assembly further includes a backlight detector;
the backlight detector is disposed on the spacer and is on a backlight side of the laser chip, and the backlight detector is electrically connected to the first spacer ground line or the second spacer ground line;
a photosensitive surface of the backlight detector faces a backlight surface of the laser chip, and the backlight detector is configured to collect light emitted from the backlight surface of the laser chip to monitor power of light emitted from the light-emitting surface of the laser chip.

9. The optical module according to claim 8, wherein the circuit board is a multi-layer board, and the circuit board further includes:
a backlight detector welding hole, a position of the backlight detector welding hole corresponding to a position of the first circuit board ground line or the second circuit board ground line, and the backlight detector welding hole being electrically connected to the first circuit board ground line or the second circuit board ground line; and
a microprocessor, the microprocessor being electrically connected to the first circuit board ground line or the second circuit board ground line at a position inside the circuit board through the backlight detector welding hole.

10. The optical module according to claim 8, wherein the light emitting assembly further includes a focusing lens;
the focusing lens is disposed on a light-emitting side of the laser chip, so as to focus light emitted by the laser chip.

11. The optical module according to claim 1, further comprising a laser driver chip;

wherein the laser driver chip is disposed on the circuit board, is electrically connected to the circuit board, and is configured to drive the laser chip to emit the optical signal.

12. The optical module according to claim 11, wherein the circuit board is a multi-layer board;

the circuit board further includes a bias current source welding hole, a position of the bias current source welding hole corresponds to a position of the first circuit board ground line or the second circuit board ground line, and the bias current source welding hole is electrically connected to the first circuit board ground line or the second circuit board ground line;

the laser driver chip is electrically connected to the first circuit board ground line or the second circuit board ground line at a position inside the circuit board through the bias current source welding hole.

13. The optical module according to claim 1, further comprising a light receiving assembly;

wherein the light receiving assembly is disposed on the circuit board and configured to convert an optical signal from an outside of the optical module into an electrical signal.

14. The optical module according to claim 1, wherein the light emitting assembly further includes a cover plate, and the cover plate is covered on a connection line;

the connection line includes at least one of the first connection line, the second connection line, the third connection line, the fourth connection line, the fifth connection line, the sixth connection line or the seventh connection line.

15. An optical module, comprising:

a circuit board including a first circuit board ground line, a second circuit board ground line and a circuit board signal line;

a light emitting assembly connected to the circuit board;

wherein the light emitting assembly includes:

a spacer including a first spacer ground line, a second spacer ground line and a spacer signal line, the first spacer ground line being connected to the first circuit board ground line through a first connection line, the spacer signal line being connected to the circuit board signal line through a second connection line, and the second spacer ground line being connected to the second circuit board ground line through a third connection line; and a laser chip disposed on the spacer and configured to emit an optical signal based on an electrical signal from the circuit board, an anode of the laser chip being electrically connected to the spacer signal line, and a cathode of the laser chip being electrically connected to the first spacer ground line or the second spacer ground line;

wherein connection relationships among the first spacer ground line, the second spacer ground line, the first circuit board ground line and the second circuit board ground line include at least one of the followings:

the first spacer ground line is connected to the second spacer ground line through a fourth connection line;

the first spacer ground line is connected to the second circuit board ground line through a fifth connection line;

the second spacer ground line is connected to the first circuit board ground line through a sixth connection line; or, the first circuit board ground line is connected to the second circuit board ground line through a seventh connection line;

wherein the spacer further includes:

a spacer ground layer, the spacer ground layer being disposed on a surface of the spacer opposite to a surface on which the first spacer ground line and the second spacer ground line are located; and a spacer ground hole corresponding to at least one of the first spacer ground line or the second spacer ground line, the spacer ground hole penetrating the spacer, so that the at least one of the first spacer ground line or the second spacer ground line is electrically connected to the spacer ground layer.

\* \* \* \* \*